United States Patent
Zuo

(10) Patent No.: US 11,039,550 B1
(45) Date of Patent: Jun. 15, 2021

(54) HEAT SINK WITH TURBULENT STRUCTURES

(71) Applicant: Google LLC, Mountain View, CA (US)

(72) Inventor: Xu Zuo, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/843,536

(22) Filed: Apr. 8, 2020

(51) Int. Cl.
| | |
|---|---|
| *H01L 23/467* | (2006.01) |
| *H01L 23/367* | (2006.01) |
| *F28F 13/12* | (2006.01) |
| *H05K 7/20* | (2006.01) |

(52) U.S. Cl.
CPC ......... *H05K 7/20409* (2013.01); *F28F 13/12* (2013.01); *H01L 23/3672* (2013.01); *H01L 23/467* (2013.01); *H05K 7/20154* (2013.01); *F28F 2215/10* (2013.01)

(58) Field of Classification Search
CPC .... H01L 23/3672; H01L 23/467; F28F 13/12; F28F 2215/10; H05K 7/20154
See application file for complete search history.

(56) References Cited

U.S. PATENT DOCUMENTS

| | | | | |
|---|---|---|---|---|
| 3,163,207 A | * | 12/1964 | Schultz | H01L 23/4006 165/68 |
| 3,265,127 A | * | 8/1966 | Nickol | F28F 1/325 165/152 |
| 5,077,601 A | * | 12/1991 | Hatada | H01L 23/467 257/722 |
| 5,224,538 A | * | 7/1993 | Jacoby | B01D 1/22 165/166 |
| 5,763,950 A | * | 6/1998 | Fujisaki | H01L 23/3672 165/80.3 |
| 5,957,194 A | * | 9/1999 | Azar | F28F 13/06 165/80.3 |
| 6,015,008 A | * | 1/2000 | Kogure | F28F 3/02 165/185 |
| 6,161,610 A | * | 12/2000 | Azar | H01L 23/467 165/80.3 |

(Continued)

FOREIGN PATENT DOCUMENTS

| | | |
|---|---|---|
| CN | 109099750 | 12/2018 |
| JP | S61134042 U * | 8/1986 |

(Continued)

OTHER PUBLICATIONS

English translation of absract for Chinese publication, CN 10909750, published Dec. 28, 2018 (Year: 2018).*

(Continued)

*Primary Examiner* — Robert J Hoffberg
(74) *Attorney, Agent, or Firm* — Fish & Richardson P.C.

(57) ABSTRACT

A planar fin for use in a heat sink includes turbulent structures extending from the sides of the planar fin. Each turbulent structure defines a longitudinal axis and having a first edge that is parallel to the longitudinal axis and connected to the a planar surface of the fin. Each turbulent structure also includes a second edge opposite the first edged and in free space. The second edge defines a periphery that varies in distance from the first edge along the length of the longitudinal axis. The periphery of each second edge is further shaped such that turbulent flow of a fluid is induced in the flow flowing over the second edge at at least a predefined flow rate.

13 Claims, 2 Drawing Sheets

(56) References Cited

U.S. PATENT DOCUMENTS

| | | | | |
|---|---|---|---|---|
| 6,170,566 | B1 * | 1/2001 | Blumel | F28F 1/128 165/152 |
| 6,234,239 | B1 * | 5/2001 | Azar | H01L 23/467 165/80.3 |
| 6,269,864 | B1 * | 8/2001 | Kabadi | F28F 3/022 165/185 |
| 6,418,020 | B1 * | 7/2002 | Lin | H01L 23/367 165/80.3 |
| 6,493,227 | B2 * | 12/2002 | Nielsen | H05K 7/20918 165/185 |
| 6,590,770 | B1 | 7/2003 | Rogers et al. | |
| 6,845,812 | B2 | 1/2005 | Turocy et al. | |
| 7,096,678 | B2 * | 8/2006 | Petroski | G06F 1/20 257/E23.099 |
| 7,289,322 | B2 * | 10/2007 | Chen | H01L 23/3672 361/695 |
| 7,355,856 | B2 * | 4/2008 | Petroski | G06F 1/20 257/706 |
| 7,474,528 | B1 * | 1/2009 | Olesiewicz | H05K 7/20154 361/694 |
| 7,760,506 | B1 * | 7/2010 | Wang | H05K 7/20727 361/709 |
| 7,974,097 | B2 * | 7/2011 | Li | H01L 23/367 361/712 |
| 8,537,548 | B2 * | 9/2013 | Bhattacharya | G06F 1/20 361/694 |
| 10,094,625 | B2 * | 10/2018 | Gotterbarm | B21J 5/068 |
| 10,139,172 | B2 * | 11/2018 | Hunt | F28F 3/025 |
| 10,974,309 | B2 * | 4/2021 | Gotterbarm | F28F 1/12 |
| 2002/0139515 | A1 | 10/2002 | Azar | |
| 2003/0016495 | A1 * | 1/2003 | Hongo | G06F 1/203 361/679.48 |
| 2003/0079860 | A1 * | 5/2003 | Hoffmann | H01L 23/467 165/80.3 |
| 2004/0261975 | A1 | 12/2004 | Kozyra et al. | |
| 2006/0102325 | A1 | 5/2006 | Li et al. | |
| 2007/0240868 | A1 * | 10/2007 | Wu | F28F 13/06 165/185 |
| 2010/0170657 | A1 | 7/2010 | Kaslusky | |
| 2011/0079370 | A1 | 4/2011 | Wen et al. | |
| 2014/0202674 | A1 * | 7/2014 | Berta | F28F 1/10 165/181 |
| 2014/0290925 | A1 * | 10/2014 | Hernon | H01L 23/467 165/185 |
| 2020/0284530 | A1 * | 9/2020 | Bai | F28F 3/027 |

FOREIGN PATENT DOCUMENTS

| | | | |
|---|---|---|---|
| JP | H04291750 | | 10/1992 |
| JP | H0846095 | | 2/1996 |
| JP | 2001345585 A | * | 12/2001 |
| KR | 19990012680 A | * | 2/1999 |
| KR | 20170037189 A | * | 4/2017 |
| WO | WO 2013/087140 | | 6/2013 |

OTHER PUBLICATIONS

English translation of absract for Japanese publication, JP H04-291750, published Oct. 15, 1992 (Year: 1992).*

English translation of absract for Japanese publication, JP H08-46095A, published Feb. 16, 1996 (Year: 1996).*

Anonymous [online], "Heat sink" Nov. 2019, [retrieved Nov. 14, 2019], retrieved from URL <https://en.wikipedia.org/wiki/Heat_sink>, 17 pages.

Simons [online], "Estimating Parallel Plate-Fin Heat Sink Thermal Resistance" Feb. 2003, [retrievef on Nov. 14, 2019], retrieved from: URL <https://www.electronics-cooling.com/2003/02/estimating-parallel-plate-fin-heat-sink-thermal-resistance/>, 11 pages.

Ventola et al, "Rough surfaces with enhanced heat transfer for electronics colling by direct metal laser sintering" Internatioanal Journal of Heat and Mass Transfer, Apr. 2014, 17 pages.

Extended European Search Report in European Application No. 20201240.7, dated Apr. 9, 2021, 9 pages.

* cited by examiner

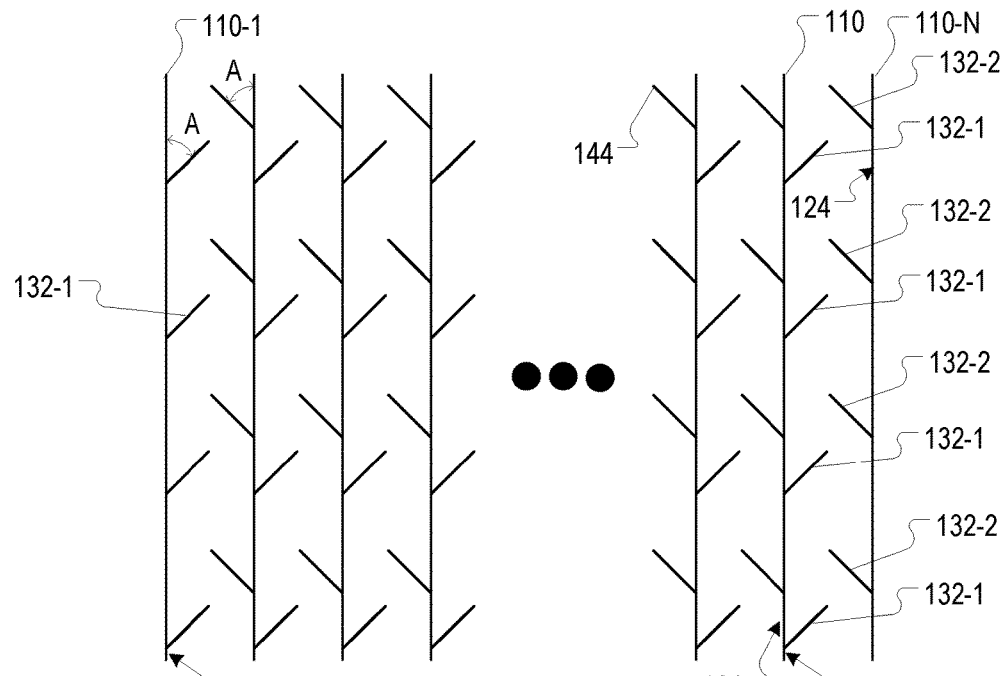
FIG. 2
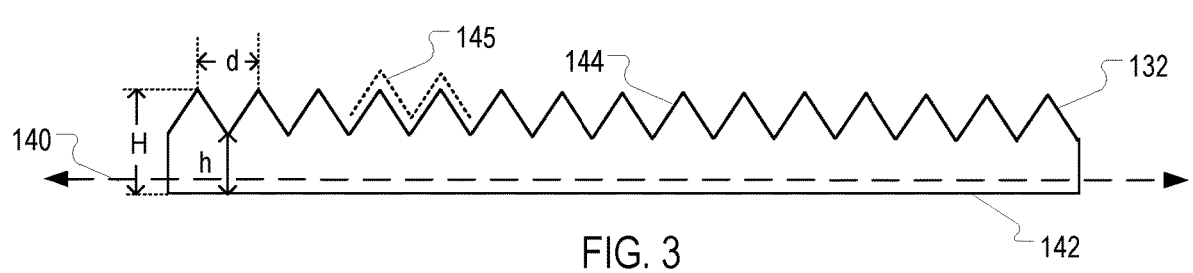
FIG. 3
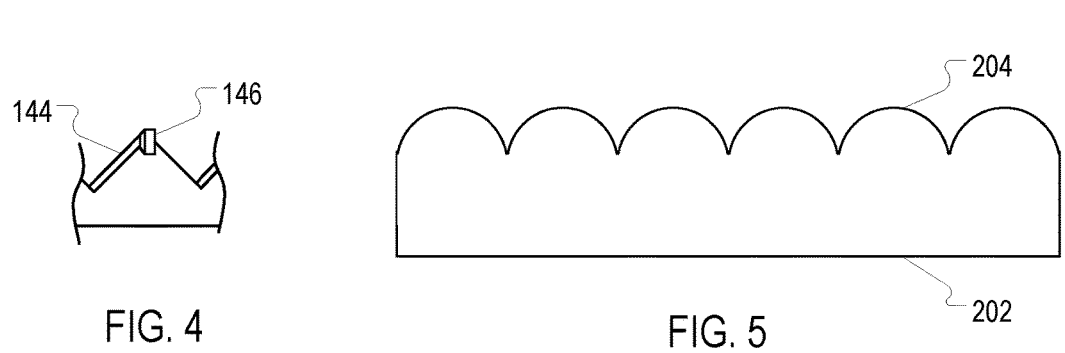
FIG. 4
FIG. 5

HEAT SINK WITH TURBULENT STRUCTURES

TECHNICAL FIELD

This specification relates generally to providing cooling to electronic equipment.

BACKGROUND

Electronic devices generate heat through power consumption. Excessive heat generation without sufficient cooling can lead to damage and failure of electronic devices. Electronic devices may be cooled by cooling systems such as heat sinks. Heat sinks are passive heat exchangers that transfer heat from electronic devices to a fluid medium.

SUMMARY

Heat sinks can be used to cool electronic devices, e.g., processors, memories, network devices, and other heat generating devices. In computing systems, heat sinks can be used to cool central processing units (CPUs), graphics processing units (GPUs), tensor processing units (TPU), chipsets, and random access memory (RAM) modules, and other electronic devices.

A heat sink is a passive heat exchanger that can transfer heat generated by an electronic device to a lower temperature fluid medium, such as air or a liquid coolant. The fluid medium removes and disperses heat from the electronic device. A heat sink can be used to lower or maintain the temperature of the electronic device, preventing the electronic device from overheating.

The amount of heat that can be removed by a heat sink is dependent on various factors, to include the surface area of the heat sink, the fluid volume and velocity through the heat sink, and the direction of fluid flow through the heat sink. Heat sink performance can be improved by increasing the amount of heat that the heat sink removes from the electronic device. Heat sink performance can also be improved by increasing the rate of heat removal from the electronic device.

In general, one innovative aspect of the subject matter described in this specification can be embodied in a heat sink including: a base defining a first side having a base planar surface and a second side opposite the first side; and a plurality of planar fins extending from the base planar surface in parallel disposition relative to each other, each planar fin of the plurality of planar fins comprising: a bottom fin edge coupled to the base planar surface and running parallel a longitudinal axis of the planar fin, a top fin edge that is opposite the bottom fin edge and running parallel the longitudinal axis of the planar fin, a leading fin edge extending from the bottom fin edge to the top fin edge, a trailing fin edge opposite the leading fin edge and extending from the bottom fin edge to the top fin edge, a fin body extending from the bottom fin edge to the top fin edge and having a first side defining a first planar surface and second side opposite the first side defining a second planar surface; and a first set of turbulent structures extending from the first planar surface, each turbulent structure in the first set of turbulent structures defining a longitudinal axis and having a first edge that is parallel to the longitudinal axis and connected to the first planar surface and a second edge opposite the first edged and in free space, the second edge defining a periphery that varies in distance from the first edge along the length of the longitudinal axis; and wherein the periphery of each second edge is further shaped such that turbulent flow of a fluid is induced in the fluid flowing over the second edge at at least a predefined flow rate.

Another innovative aspect of the subject matter described in this specification can be embodied in a planar fin comprising a bottom fin edge coupled to the base planar surface and running parallel a longitudinal axis of the planar fin; a top fin edge that is opposite the bottom fin edge and running parallel the longitudinal axis of the planar fin; a leading fin edge extending from the bottom fin edge to the top fin edge; a trailing fin edge opposite the leading fin edge and extending from the bottom fin edge to the top fin edge; a fin body extending from the bottom fin edge to the top fin edge and having a first side defining a first planar surface and second side opposite the first side defining a second planar surface; and a first set of turbulent structures extending from the first planar surface, each turbulent structure in the first set of turbulent structures defining a longitudinal axis and having a first edge that is parallel to the longitudinal axis and connected to the first planar surface and a second edge opposite the first edged and in free space, the second edge defining a periphery that varies in distance from the first edge along the length of the longitudinal axis; and wherein the periphery of each second edge is further shaped such that turbulent flow of a fluid is induced in the flow flowing over the second edge at at least a predefined flow rate.

Another innovative aspect of the subject matter described in this specification can be embodied in a heat sink including heat sink comprising: a base defining a first side having a base planar surface and a second side opposite the first side; and a plurality of planar fins extending from the base planar surface in parallel disposition relative to each other, each planar fin of the plurality of planar fins comprising: a bottom fin edge coupled to the base planar surface and running parallel a longitudinal axis of the planar fin; a top fin edge that is opposite the bottom fin edge and running parallel the longitudinal axis of the planar fin; a leading fin edge extending from the bottom fin edge to the top fin edge; a trailing fin edge opposite the leading fin edge and extending from the bottom fin edge to the top fin edge; fin body extending from the bottom fin edge to the top fin edge and having a first side defining a first planar surface and second side opposite the first side defining a second planar surface; and means for inducing turbulent flow extending from the first planar surface and that induce turbulent flow of a fluid flowing over the means at at least a predefined flow rate.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 2 is top view of the planar fins with turbulent structures.

FIG. 3 is a side view of a turbulent structure.

FIG. 4 is a perspective view of a turbulent structure with a terminal nub.

FIG. 5 is a side view of another turbulent structure.

Like reference numbers and designations in the various drawings indicate like elements.

DETAILED DESCRIPTION

Figure 1:
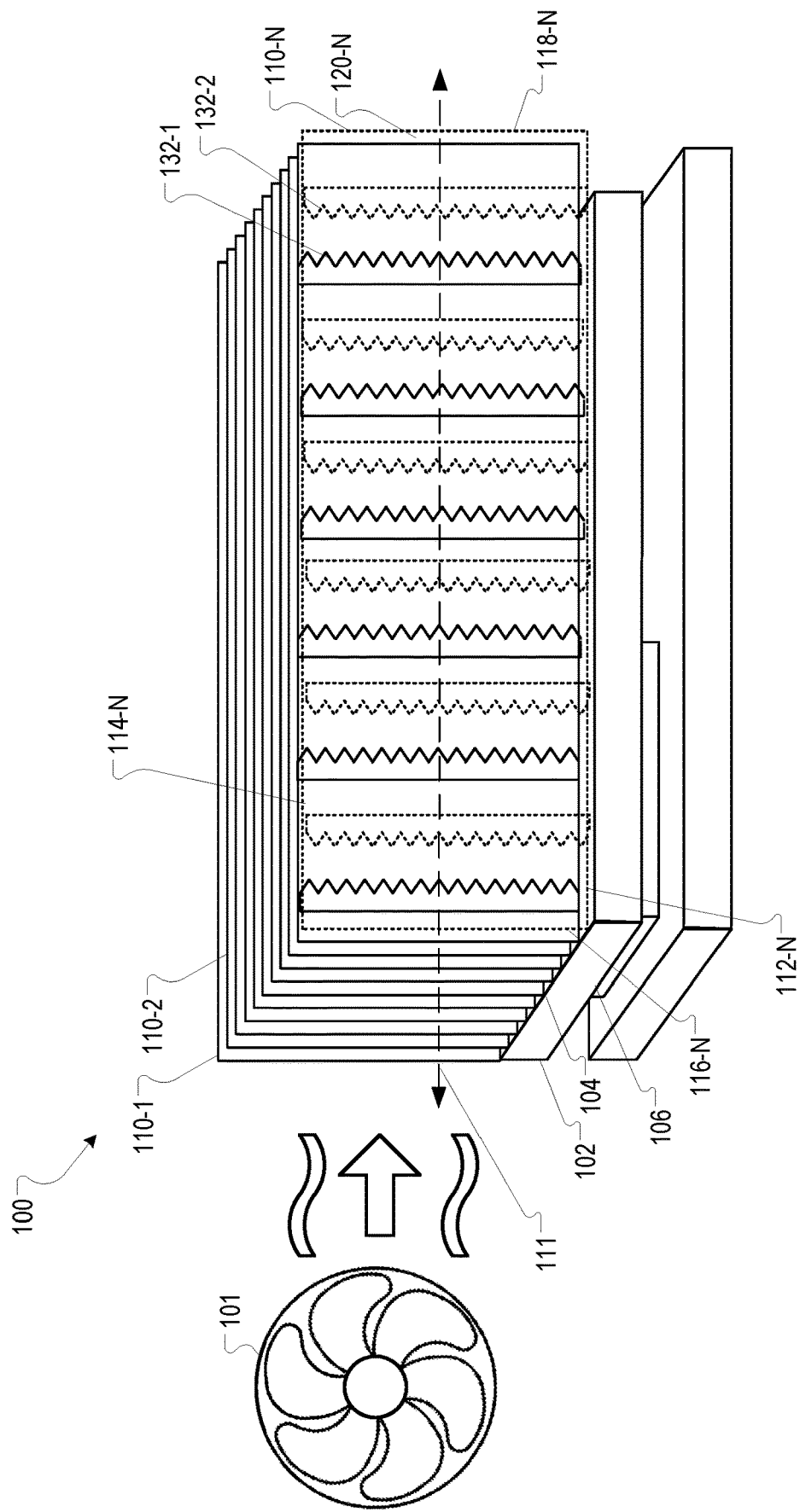
FIG. 1 is a diagram of an example heat sink with planar fins that include turbulent structures.

Heatsink performance is improved when turbulent flow occurs between the fins when the fluid flows at the predefined rate. To induce turbulent flow, the planar fins of the heat sink include a set of turbulent structures. The turbulent structures extend from a first planar surface of the fin, e.g., a first side of the fin. Each turbulent structure in the first set of turbulent structures defines a longitudinal axis and has a first edge that is parallel to the longitudinal axis and connected to the first planar surface. Each turbulent structure also has a second edge opposite the first edge and in free space. The second edge defines a periphery that varies in distance from the first edge along the length of the longitudinal axis. For example, the periphery can be saw tooth shaped, straight tooth shaped, or even curved. The periphery of each second edge is further shaped such that turbulent flow of a fluid is induced in the fluid flowing over the second edge at at least a predefined flow rate.

Turbulent structures can also be attached to the other side of the heatsink fin and offset from the structures on the first side of the heatsink fin. In this configuration, the turbulent structures extend into the space between heatsinks from both heatsink surfaces. With higher turbulence, the heat sink realizes a higher heat transfer coefficient h that would otherwise be realized with smooth fins. This leads to better convection cooling capabilities. Thus, the principle of this design is to add turbulence enhancement features on the heatsink fins to increase heat transfer coefficient.

These features and additional features are described in more detail below.

FIG. 1 is a diagram of an example heat sink 100 with planar fins 110 that include turbulent structures 132. The heat sink 100 includes a base 102 defining a first side 104 having a base planar surface, and a second side 106 opposite the first side 104. A set of planar fins 110 (e.g., 110-1 ... N) extend from the base planar surface 106 in parallel disposition relative to each other. Each planar fin 110 includes a bottom fin edge 112 coupled to the base planar surface 106 and running parallel to a longitudinal axis 111 of the planar fin 110. Each planar fin 110 also is defined by a top fin edge 114 that is opposite the bottom fin edge 112 and running parallel to the longitudinal axis 111 of the planar fin, and is further defined by a leading fin edge 116 extending from the bottom fin 112 edge to the top fin edge 114, and a trailing fin edge 118 opposite the leading fin edge 114 and extending from the bottom fin edge 112 to the top fin edge 114.

FIG. 2 is top view of the planar fins 110 with turbulent structures 132. Each fin 110 defines a fin body 120 extending from the bottom fin edge 112 to the top fin edge 114 and having a first side 122 defining a first planar surface and second side 124 opposite the first side defining a second planar surface. To avoid congestion in the drawings, like elements for all fins 110 are not labeled.

In some implementations, except for exterior fins 110-1 and 110-N, each planar fin 110 includes a first set of turbulent structures 132-1 extending from the first planar surface 122, and a second set of turbulent structures 132-2 extending from the second planar surface 124. Exterior fin 110-1, however, includes only a first set of turbulent structures 132-1 on the first planar surface 122. Conversely, exterior fin 110-N includes only a second set of turbulent structures 132-2 on the second planar surface 124. In other implementations, exterior fins 110-1 and 110-N have turbulent structures 132 on both of their respective first planar surface 122 and second planar surface 124.

The turbulent structures 132 are uniformly spaced apart, and each respective set 132-1 and 132-2 are offset from each other so as to not overly reduce airflow that would otherwise result if the sets 132-1 and 132-2 were not offset.

FIG. 3 is a side perspective of a turbulent structure 132. Each turbulent structure 132 defines longitudinal axis 140 and having a first edge 142 that is parallel to the longitudinal axis 140. The first edge 142 is connected to the planar surface 122 or 124. In some implementations, the turbulent structures 132 are connected at an acute angle A, as shown in FIG. 2. The turbulent structure 132 includes a second edge 144 opposite the first edge 142. The second edge, as shown in FIG. 2, is in free space such that air may flow over the second edge 142. The second edge 144 defines a periphery 145 (a second edge of which is shown in phantom and offset in FIG. 2) that varies in distance from the first edge 142 along the length of the longitudinal axis 140. The periphery 145 of each second edge 144 is further shaped such that turbulent flow of a fluid is induced in the fluid flowing over the second edge 144 at at least a predefined flow rate, e.g., at a flow rate induced by a fan 101. As shown in FIG. 3, the periphery 145 varies linearly in distance from the edge 142 from a maximum distance of H to a minimum distance of h, with the relative maximum and minimum spaced apart by a distance d. The values of A, H, h and d can be varied to achieve different heat transfer coefficients. Such heat transfer coefficients can be measured empirically, for example.

The triangular shape of FIG. 3 is but one example of a periphery that can be used. For example, as shown in FIG. 5, a turbulent structure 202 with a curved periphery pattern 204 can be used. Other periphery patterns can also be used, such as a saw-tooth pattern, a straight tooth pattern, or still other patterns.

In some implementations, the second edge 144 has a uniform cross section. In other implementations, however, each second edge 144 may include terminal nubs 146 to further increase turbulent flow. As shown in FIG. 4, the terminal nub 146 is pyramidal in shape; however, a variety of other shapes can be used.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A heat sink comprising:
a base defining a first side having a base planar surface and a second side opposite the first side; and
a plurality of planar fins extending from the base planar surface in parallel disposition relative to each other, each planar fin of the plurality of planar fins comprising:
a fin body having a first side defining a first planar surface and second side opposite the first side defining a second planar surface, a periphery of the fin body defined by:
a bottom fin edge coupled to the base planar surface and running parallel a fin longitudinal axis of the planar fin;
a top fin edge that is opposite the bottom fin edge and running parallel the fin longitudinal axis of the planar fin;
a leading fin edge extending from the bottom fin edge to the top fin edge;
a trailing fin edge opposite the leading fin edge and extending from the bottom fin edge to the top fin edge;
and
a first set of turbulent structures extending from the first planar surface, each of the first set of turbulent structures defining a first longitudinal axis and having a first structure body, a periphery of the first structure body defined by:
a first bottom structure edge substantially flush with the bottom fin edge;
a first top structure edge that is opposite the first bottom structure edge and substantially flush with the top fin edge;
a first edge that is parallel to the first longitudinal axis and attached to the first planar surface, the first edge extending between the first bottom structure edge and the first top structure edge; and
a second edge in a first free space adjacent to the first planar surface, the second edge opposite and spaced apart from the first edge, the second edge varies in distance from the first edge along a length of the first longitudinal axis;
wherein the second edge is further shaped such that a first turbulent flow of a fluid is induced in the fluid flowing over the second edge at at least a predefined flow rate.

2. The heat sink of claim 1, wherein each planar fin further includes a second set of turbulent structures extending from the second planar surface, each of the second set of turbulent structures defining a second longitudinal axis and having a second structure body, a periphery of the second structure body defined by:
a second bottom structure edge substantially flush with the bottom fin edge;
a second top structure edge that is opposite the second bottom structure edge and substantially flush with the top fin edge;
a third edge that is parallel to the second longitudinal axis and attached to the second planar surface, the third edge extending between the second bottom structure edge and the second top structure edge; and
a fourth edge in a second free space adjacent to the second planar surface, the fourth edge opposite and spaced apart from the third edge and in a second free space adjacent to the second planar surface, the fourth edge varies in distance from the third edge along a length of the second longitudinal axis, the fourth edge varies in distance from the third edge along a length of the second longitudinal axis;
wherein the fourth edge is further shaped such that a second turbulent flow of the fluid is induced in the fluid flowing over the fourth edge at at least the predefined flow rate or another predefined flow rate.

3. The heat sink of claim 2, wherein for each planar fin, the first set of turbulent structures are connected to the planar fin at respective first positions along the fin longitudinal axis of the planar fin, and the second set of turbulent structures are attached to the planar fin at respective second positions along the fin longitudinal axis of the planar fin, and wherein the respective first positions are offset from the respective second positions along the fin longitudinal axis of the planar fin.

4. The heat sink of claim 3, wherein the second edge of the first set of turbulent structures and the fourth edge of the second set of turbulent structures each define a saw-tooth pattern.

5. The heat sink of claim 3, wherein the second edge of the first set of turbulent structures and the fourth edge of the second set of turbulent structures each define a straight-tooth pattern.

6. The heat sink of claim 3, wherein the second edge of the first set of turbulent structures and the fourth edge of the second set of turbulent structures each define a curved pattern.

7. The heat sink of claim 3, wherein each first structure body in the first set of turbulent structures is attached to the first planar surface at a first acute angle relative to the first planar surface; and
each second structure body in the second set of turbulent structures is attached to the second planar surface at a second acute angle relative to the second planar surface.

8. The heat sink of claim 7, wherein each of the first acute angle and the second acute angle is measured relative to the trailing fin edge.

9. The heat sink of claim 1, wherein the second edge of the first set of turbulent structures and the fourth edge of the second set of turbulent structures each define a saw-tooth pattern.

10. The heat sink of claim 1, wherein the second edge of the first set of turbulent structures and the fourth edge of the second set of turbulent structures each define a straight-tooth pattern.

11. The heat sink of claim 1, wherein the second edge of the first set of turbulent structures and the fourth edge of the second set of turbulent structures each define a curved pattern.

12. The heat sink of claim 1, wherein each first structure body in the first set of turbulent structures is attached to the first planar surface at a first acute angle relative to the first planar surface; and
each second structure body in the second set of turbulent structures is attached to the second planar surface at a second acute angle relative to the second planar surface.

13. The heat sink of claim 12, wherein each of the first acute angle and the second acute angle is measured relative to the trailing fin edge.

\* \* \* \* \*